United States Patent
Inoue

(10) Patent No.: US 6,972,456 B2
(45) Date of Patent: *Dec. 6, 2005

(54) SEMICONDUCTOR DEVICE AND METHOD OF FABRICATING THE SAME

(75) Inventor: Susumu Inoue, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/636,562

(22) Filed: Aug. 8, 2003

(65) Prior Publication Data

US 2004/0072402 A1    Apr. 15, 2004

(30) Foreign Application Priority Data

Sep. 2, 2002    (JP) .............................. 2002-256875

(51) Int. Cl.[7] .......................................... H01L 29/788
(52) U.S. Cl. .................................................... 257/316
(58) Field of Search ......... 257/315–324; 438/257–267

(56) References Cited

U.S. PATENT DOCUMENTS

| | | | |
|---|---|---|---|
| 4,997,781 A * | 3/1991 | Tigelaar | 438/257 |
| 5,408,115 A | 4/1995 | Chang | |
| 5,422,504 A | 6/1995 | Chang et al. | |
| 5,494,838 A | 2/1996 | Chang et al. | |
| 5,969,383 A | 10/1999 | Chang et al. | |
| 6,177,318 B1 | 1/2001 | Ogura et al. | |
| 6,248,633 B1 | 6/2001 | Ogura et al. | |
| 6,255,166 B1 | 7/2001 | Ogura et al. | |
| 6,413,821 B1 | 7/2002 | Ebina et al. | |
| 6,518,124 B1 | 2/2003 | Ebina et al. | |
| 6,531,350 B2 * | 3/2003 | Satoh et al. | 438/197 |
| 6,627,491 B2 | 9/2003 | Ebina et al. | |
| 6,656,794 B2 | 12/2003 | Shibata | |
| 6,664,155 B2 | 12/2003 | Kasuya | |
| 6,809,374 B2 | 10/2004 | Takamura | |
| 2002/0100929 A1 | 8/2002 | Ebina et al. | |
| 2002/0127805 A1 | 9/2002 | Ebina et al. | |
| 2003/0057505 A1 | 3/2003 | Ebina et al. | |
| 2003/0058705 A1 | 3/2003 | Ebina et al. | |
| 2003/0060011 A1 | 3/2003 | Ebina et al. | |
| 2003/0157767 A1 | 8/2003 | Kasuya | |
| 2003/0166321 A1 | 9/2003 | Kasuya | |
| 2003/0166322 A1 | 9/2003 | Kasuya | |
| 2003/0190805 A1 | 10/2003 | Inoue | |
| 2003/0211691 A1 | 11/2003 | Ueda | |

FOREIGN PATENT DOCUMENTS

JP    A 7-161851    6/1995

(Continued)

OTHER PUBLICATIONS

U.S. Appl. No. 10/689,987, filed Oct. 22, 2003, Kasuya.

(Continued)

*Primary Examiner*—Richard A. Booth
(74) *Attorney, Agent, or Firm*—Oliff & Berridge, PLC

(57) ABSTRACT

A semiconductor device having a memory region formed of non-volatile memory devices arranged in a matrix of a plurality of rows and columns. Each non-volatile memory device has a word gate formed above a semiconductor layer with a gate insulating layer interposed, an impurity layer formed in the semiconductor layer to form a source region or a drain region, and control gates formed in the form of side walls formed along both side surfaces of the word gate. Each control gate includes a first control gate and a second control gate in mutual contact, where the first and second control gates are respectively formed on charge accumulation layers of different thicknesses.

4 Claims, 15 Drawing Sheets

FOREIGN PATENT DOCUMENTS

| JP | B1 2978477 | 9/1999 |
|---|---|---|
| JP | A 2001-156188 | 6/2001 |

OTHER PUBLICATIONS

U.S. Appl. No. 10/636,581, filed Aug. 8, 2003, Yamamukai.
U.S. Appl. No. 10/636,582, filed Aug. 8, 2003, Inoue.
U.S. Appl. No. 10/614,985, filed Jul. 9, 2003, Inoue.
U.S. Appl. No. 10/690,025, filed Oct. 22, 2003, Kasuya.
U.S. Appl. No. 10/689,990, filed Oct. 22, 2003, Kasuya.
U.S. Appl. No. 10/689,993, filed Oct. 22, 2003, Kasuya.

Yutaka Hayashi et al. "Twin MONOS Cell with Dual Control Gates" 2000 Symposium on VLSI Technology Digest of Technical Papers.

Kuo-Tung Chang et al. "A New SONOS Memory Using Source-Side Injection for Programming" IEEE Electron Device Letters, vol. 19, No. 7, Jul. 1998.

Wei-Ming Chen et al. "A Novel Flash Memory Device with Split Gate Source Side Injection and OnO Charge Storage Stack (SPIN)" 1997 Symposium on VLSI Technology Digest of Technical Papers.

* cited by examiner

SEMICONDUCTOR DEVICE AND METHOD OF FABRICATING THE SAME

Japanese Patent Application No. 2002-256875, filed on Sep. 2, 2002, is hereby incorporated by reference in its entirety.

BACKGROUND OF THE INVENTION

The present invention relates to a semiconductor device having a memory region and a method of fabricating such a semiconductor device, and, in particular, to a semiconductor device wherein a non-volatile memory device formed within the memory region has two charge accumulation regions for each word gate, and a method of fabricating the semiconductor device.

One type of non-volatile semiconductor memory device is called a metal-oxide-nitride-oxide semiconductor (MONOS) type or a silicon-oxide-nitride-oxide-silicon (SONOS) type, wherein a gate insulating layer between a channel region and a control gate is formed of a multi-layer stack of silicon oxide and silicon nitride layers, and charge is trapped in the silicon nitride layer.

A device shown in FIG. 14 is known as an example of this MONOS type of non-volatile semiconductor memory device (disclosed by Y. Hayashi, et al, in 2000 Symposium on VLSI Technology Digest of Technical Papers, pp. 122–123).

In this MONOS memory cell 100, a word gate 14 is formed on a semiconductor substrate 10 with a gate insulating layer 12 therebetween. A control gate 20 and a control gate 30 are disposed on either side of the word gate 14, in the shape of side walls. There is an insulating layer 22 between a base portion of the control gate 20 and the semiconductor substrate 10, and a side insulating layer 26 between a side surface of the control gate 20 and the word gate 14. In a similar manner, the insulating layer 22 is between a base portion of the control gate 30 and the semiconductor substrate 10, and the side insulating layer 26 is between a side surface of the control gate 30 and the word gate 14. Impurity layers 16 and 18, which are to form a source region and drain region, are formed in the semiconductor substrate 10 between the opposing control gates 20 and 30 of neighboring memory cells.

In this manner, each memory cell 100 has two MONOS memory elements on the side surfaces of the word gate 14. These two MONOS memory elements can be controlled independently. Thus one memory cell 100 can store two bits of information.

BRIEF SUMMARY OF THE INVENTION

The present invention may provide a semiconductor device comprising MONOS type non-volatile memory devices, each having two charge accumulation regions, and particularly a semiconductor device having resistance to deterioration during the writing/erasing of data, and a method of fabrication thereof.

According to a first aspect of the present invention, there is provided a semiconductor device having a memory region in which a memory cell array is formed of non-volatile memory devices arranged in a matrix of a plurality of rows and columns, wherein each of the non-volatile memory devices has:

a word gate formed above a semiconductor layer with a gate insulating layer interposed;

an impurity layer formed in the semiconductor layer to form a source region or a drain region; and control gates in the form of side walls formed along both side surfaces of the word gate;

wherein each of the control gates includes a first control gate and a second control gate in mutual contact;

wherein a first insulating layer is disposed between the first control gate and the semiconductor layer, and a side insulating layer is disposed between the first control gate and the word gate;

wherein a second insulating layer is disposed between the second control gate and the semiconductor layer; and wherein the thickness of the first insulating layer is larger than the thickness of the second insulating layer.

According to a second aspect of the present invention, there is provided a method of fabricating a semiconductor device having a memory region in which a memory cell array is formed of non-volatile memory devices arranged in a matrix of a plurality of rows and columns, the method comprising:

(a) forming a gate insulating layer above a semiconductor layer;

(b) forming a first conductive layer above the gate insulating layer;

(c) forming a stopper layer above the first conductive layer;

(d) patterning the stopper layer and the first conductive layer to form a stack of layers formed of that stopper layer and that first conductive layer;

(e) forming a first insulating layer at least above the semiconductor layer and along both side surfaces of the first conductive layer;

(f) forming a second conductive layer over the entire surface of the memory region, and forming side-wall-shaped first control gates on the semiconductor layer and on both side surfaces of the first conductive layer by anisotropic etching of the second conductive layer, with the first insulating layer interposed;

(g) using the first control gates as masks to remove part of the first insulating layer, and defining part of the remaining first insulating layer under the removed portion as a second insulating layer;

(h) forming a third conductive layer over the entire surface of the memory region, and forming a second control gate on the semiconductor layer and on a side surface of each of the first control gates by anisotropic etching of the third conductive layer, with the second insulating layer interposed;

(i) forming an impurity layer in the semiconductor layer to form a source region or a drain region;

(j) forming a third insulating layer over the entire surface of the memory region and removing part of the third insulating layer to expose part of the stopper layer; and (k) removing the stopper layer, forming a fourth conductive layer over the entire surface of the semiconductor layer, and then patterning the fourth conductive layer to form a word line.

DETAILED DESCRIPTION OF THE EMBODIMENT

Figure 1:
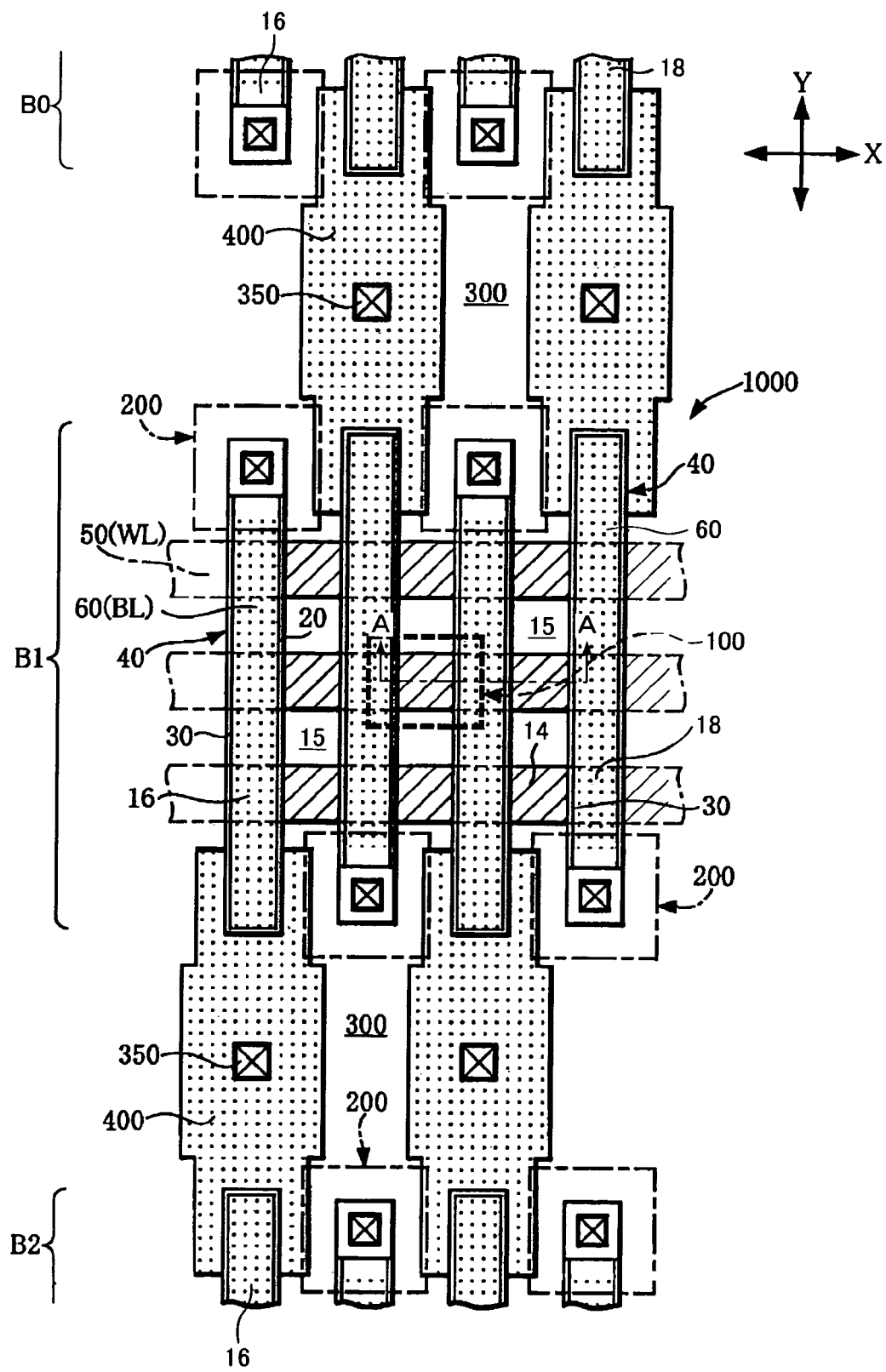
FIG. 1 is a schematic plan view of the layout of the memory region of a semiconductor device.

According to one embodiment of the present invention, there is provided a semiconductor device having a memory region in which a memory cell array is formed of non-volatile memory devices arranged in a matrix of a plurality of rows and columns, wherein each of the non-volatile memory devices has:

a word gate formed above a semiconductor layer with a gate insulating layer interposed;

an impurity layer formed in the semiconductor layer to form a source region or a drain region; and control gates in the form of side walls formed along both side surfaces of the word gate;

wherein each of the control gates includes a first control gate and a second control gate in mutual contact;

wherein a first insulating layer is disposed between the first control gate and the semiconductor layer, and a side insulating layer is disposed between the first control gate and the word gate;

wherein a second insulating layer is disposed between the second control gate and the semiconductor layer; and wherein the thickness of the first insulating layer is larger than the thickness of the second insulating layer.

Each of the control gates of the semiconductor device in accordance with this embodiment includes a first control gate and a second control gate respectively formed above insulating layers of different thicknesses. For that reason, the potential of the substrate surface under each control gate varies in two stages, making it possible to provide a semiconductor device with a non-uniform field strength.

The semiconductor device in accordance with this embodiment could have following features.

(A) In this semiconductor device, the first insulating layer may be a stack of a first silicon oxide layer, a silicon nitride layer, and a second silicon oxide layer.

(B) In this semiconductor device, the second insulating layer may be a stack of a silicon oxide layer and a silicon nitride layer.

According to another embodiment of the present invention, there is provided a method of fabricating a semiconductor device having a memory region in which a memory cell array is formed of non-volatile memory devices arranged in a matrix of a plurality of rows and a plurality of columns, the method comprising:

(a) forming a gate insulating layer above a semiconductor layer;

(b) forming a first conductive layer above the gate insulating layer;

(c) forming a stopper layer above the first conductive layer;

(d) patterning the stopper layer and the first conductive layer to form a stack of layers formed of that stopper layer and that first conductive layer;

(e) forming a first insulating layer at least above the semiconductor layer and along both side surfaces of the first conductive layer;

(f) forming a second conductive layer over the entire surface of the memory region, and forming side wall-shaped first control gates on the semiconductor layer and on both side surfaces of the first conductive layer by anisotropic etching of the second conductive layer, with the first insulating layer interposed;

(g) using the first control gates as masks to remove part of the first insulating layer, and defining part of the remaining first insulating layer under the removed portion as a second insulating layer;

(h) forming a third conductive layer over the entire surface of the memory region, and forming a second control gate on the semiconductor layer and on a side surface of each of the first control gates by anisotropic etching of the third conductive layer, with the second insulating layer interposed;

(i) forming an impurity layer in the semiconductor layer to form a source region or a drain region;

(j) forming a third insulating layer over the entire surface of the memory region and removing part of the third insulating layer to expose part of the stopper layer; and (k) removing the stopper layer, forming a fourth conductive layer over the entire surface of the semiconductor layer, and then patterning the fourth conductive layer to form a word line.

In the method of fabricating a semiconductor device in accordance with this embodiment, each control gate is formed by a two-stage process. Specifically, the first control gate is formed above the first insulating layer, and then a second insulating layer is formed by removing part of the first insulating layer. The control gate is completed by forming the second control gate above the second insulating layer. Thus the control gate is formed above insulating layers of different film thicknesses. As a result, it is possible to fabricate a semiconductor device in which the field strength of the control gate and the substrate surface is non-uniform.

The method of fabricating a semiconductor device in accordance with this embodiment could have following features.

(A) This method of fabricating a semiconductor device may further comprise etching the first control gate in step (h).

(B) This method of fabricating a semiconductor device may further comprise removing part of the first insulating layer by wet etching in step (g).

(C) This method of fabricating a semiconductor device may further comprise removing part of the first insulating layer by dry etching in step (g).

(D) This method of fabricating a semiconductor device may further comprise removing part of the third insulating layer by polishing in step (j).

(E) In this method of fabricating a semiconductor device, the first insulating layer may be a stack of a first silicon oxide layer, a silicon nitride layer, and a second silicon oxide layer.

(F) In this method of fabricating a semiconductor device, the second insulating layer may be a stack of a silicon oxide layer and a silicon nitride layer.

A semiconductor device and a method of fabrication thereof in accordance with these embodiments are described in detail below.

1. Configuration of Semiconductor Device

A plan view of the layout of a semiconductor device in accordance with this embodiment is shown in FIG. 1. The semiconductor device comprises a memory region 1000 having a non-volatile memory device.

MONOS type non-volatile memory devices (hereinafter called "memory cells") are disposed within the memory region 1000 in a lattice array of a plurality of rows and columns. A first block B1 and parts of blocks B0 and B2 adjacent thereto are shown in this memory region 1000. The blocks B0 and B2 are configured opposite to block B1.

An element isolation region 300 is formed in each partial region between the first block B1 and the adjacent block B0 or B2. Each block is provided with a plurality of word lines 50 (WL) extending in an X direction (row direction) and a plurality of bit lines 60 (BL) extending in a Y direction (column direction). Each word line 50 is connected to a plurality of word gates 14 disposed in the X direction. Each bit line 60 is configured of impurity layers 16 and 18.

A conductive layer 40 that will form first and second control gates 20 and 30 is formed so as to surround each of the impurity layers 16 and 18. In other words, the control gates 20 and 30 each extend in the Y direction and the portions at one end of the pair of control gates 20 and 30 are connected together by the conductive layer extending in the X direction. The other end portions of each pair of the control gates 20 and 30 are connected to one common contact portion 200. Thus, the conductive layer 40 functions both as a control gate for a memory cell and as wiring that connects the control gates that are arrayed in the Y direction.

A single memory cell 100 comprises one word gate 14, the control gates 20 and 30, and the impurity layers 16 and 18. The control gates 20 and 30 are formed on either side of the word gate 14. The impurity layers 16 and 18 are formed on the outer sides of the control gates 20 and 30. The impurity layers 16 and 18 are owned in common by adjacent memory cells 100.

The impurity layer 16 formed in block B1 and the impurity layer 16 formed in block B2, which are impurity layers 16 that are mutually adjacent in the Y direction, are electrically connected together by a contact impurity layer 400. This contact impurity layer 400 is formed on the opposite side of the impurity layer 16 from a common contact section 200.

A contact 350 is formed on top of this contact impurity layer 400. The bit line 60 formed by the impurity layer 16 is connected electrically to a wiring layer in an upper layer by this contact 350.

Similarly, two impurity layers 18 that are mutually adjacent in the Y direction (the impurity layer 18 formed in block B1 and the impurity layer 18 formed in block B0) are electrically connected by the contact impurity layer 400 on the sides on which the common contact portions 200 are not disposed. As can be seen from FIG. 1, the layout in plan of a plurality of the common contact portions 200 in one block is formed on alternating sides of the impurity layers 16 and the impurity layers 18, in a zigzag arrangement. The layout in plan of a plurality of the contact impurity layers 400 is formed on alternating sides of the impurity layers 16 and the impurity layers 18, in a zigzag arrangement.

Figure 2:
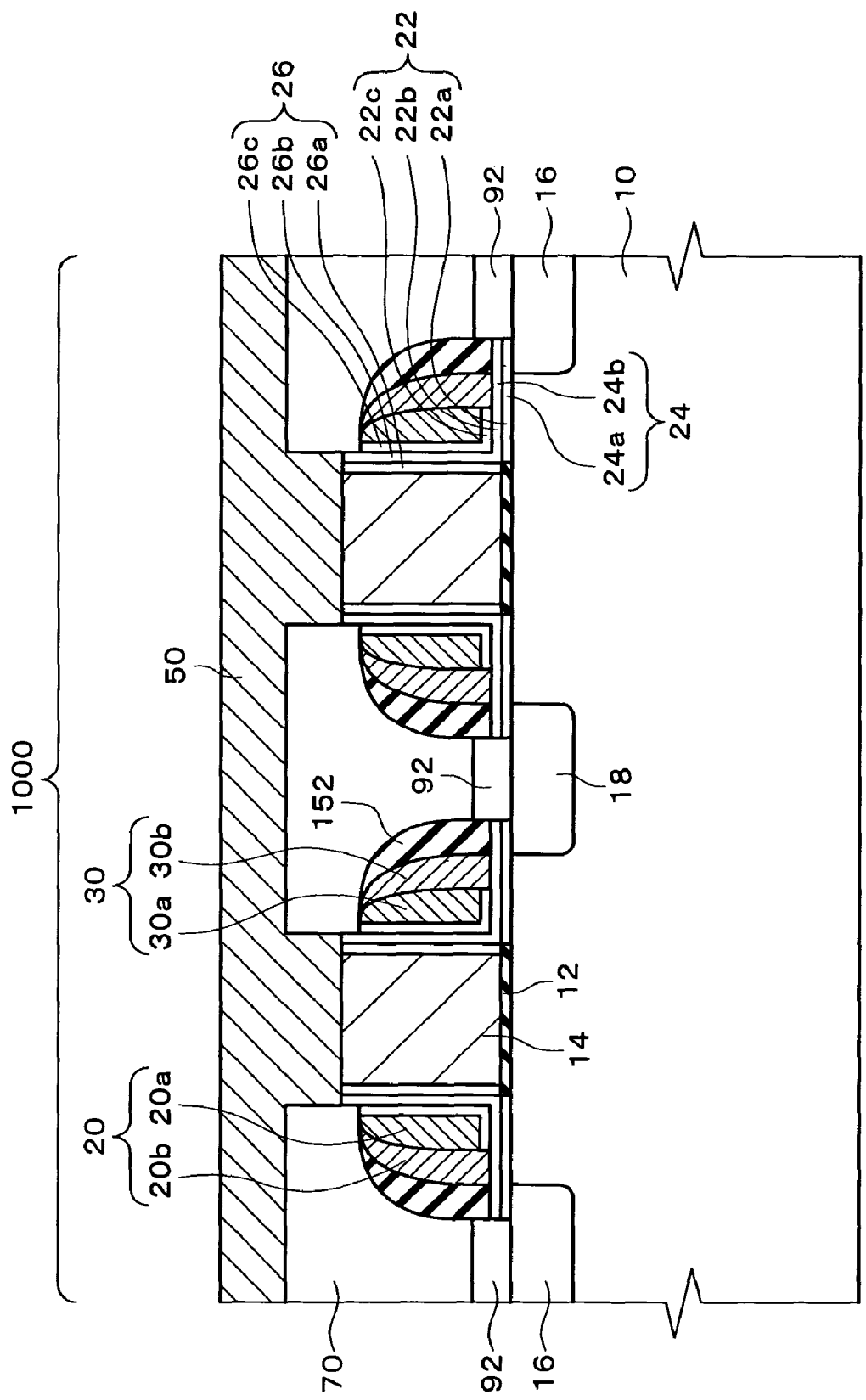
FIG. 2 is a schematic section taken along the line A—A of FIG. 1.

The description now turns to the configuration of the semiconductor device is section, with reference to FIG. 2. FIG. 2 is a section taken along the line A—A of FIG. 1.

The memory cell 100 in the memory region 1000 comprises the word gate 14, the impurity layers 16 and 18, and the control gates 20 and 30. The word gate 14 is formed above the semiconductor substrate 10 with a gate insulating layer 12 therebetween. The impurity layers 16 and 18 are formed within the semiconductor substrate 10. Each impurity layer will form a source region or a drain region. A silicide layer 92 is formed above the impurity layers 16 and 18.

The control gates 20 and 30 are formed on either side of the word gate 14. The control gate 20 is formed of a first control gate 20a and a second control gate 20b. The first control gate 20a is formed above the semiconductor substrate 10 with a first insulating layer 22 therebetween and is also formed on a side surface of the word gate 14 with a side insulating layer 26 therebetween. The second control gate 20b is formed above the semiconductor substrate with a second insulating layer 24 therebetween. Similarly, the control gate 30 includes a first control gate 30a and a second control gate 30b.

The first insulating layer 22 is an ONO film. More specifically, the first insulating layer 22 is a stack of a bottom silicon oxide layer (first silicon oxide layer) 22a, a silicon nitride layer 22b, and a top silicon oxide layer (second silicon oxide layer) 22c, in sequence from the semiconductor substrate 10 side.

The second insulating layer 24 is an NO film. More specifically, the second insulating layer 24 is a stack of a bottom silicon oxide layer (first silicon oxide layer) 24a and a silicon nitride layer 24b.

The first silicon oxide layer 22a forms a potential barrier between a channel region and a charge accumulation region. The silicon nitride layer 22b functions as a charge accumulation region that traps carriers (such as electrons). The second silicon oxide layer 22c forms a potential barrier between the control gate and the charge accumulation region.

The side insulating layer 26 is an ONO film. More specifically, the side insulating layer 26 is a stack of a first silicon oxide layer 26a, a silicon nitride layer 26b, and a second silicon oxide layer 26c, in sequence from the word gate 14 side. The side insulating layer 26 isolates the word gate 14 from each of the control gates 20 and 30. The upper edge of at least the first silicon oxide layer 26a of the side insulating layer 26 is positioned higher above the semiconductor substrate 10 than the upper edges of the control gates 20 and 30 in order to prevent any short-circuiting between the word gate 14 and the control gates 20 and 30.

The side insulating layer 26 and the first insulating layer 22 have a similar stack configuration.

The surface of each of the control gates 20 and 30 is covered by a side-wall insulating layer 152.

An embedded insulating layer 70 is formed between the neighboring control gate 20 and control gate 30 of adjacent memory cells 100. This embedded insulating layer 70 covers them in such a manner that at least the control gates 20 and 30 are not exposed. In addition, the upper surface of the embedded insulating layer 70 is positioned higher above the semiconductor substrate 10 than the upper surface of the word gate 14. Forming the embedded insulating layer 70 in this manner makes it possible to provide reliable electrical isolation between the word gate 14 and the word line 50.

The word line 50 is formed above the word gate 14 as shown in FIG. 2.

In the semiconductor device in accordance with this embodiment, each of the control gates 20 and 30 is formed of the first control gate 20a/30a and the second control gate 20b/30b that are formed above insulating layers of different film thicknesses. For that reason, the potential of the substrate surface below the control gates 20 and 30 also changes in a two-stage manner, and the field strength has peaks in three locations on each side of the word gate: at the boundaries between the word gate 14 and the control gates 20 and 30, the boundaries between the first control gates 20a and 30a and the second control gates 20b and 30b, and the edge portions of the impurity regions. This has the advantages relating to the writing and erasing of data with respect to the memory cell 100, as described below.

The description first concerns data write. During data write, electrons that have migrated into the impurity region 16 receive energy at the boundary between the word gate 14 and the control gate 30 and again receive energy at the boundary region between the first control gate 30a and the second control gate 30b, to become hot electrons, and are implanted and trapped in the first insulating layer 22 in the vicinity of the stepped portion.

In the semiconductor device in accordance with this embodiment, the positions at which the electrons are implanted are distributed about the center of the boundary portion of the first control gate 30a and the second control gate 30b. Since the second insulating layer 24 formed of an NO film is below the second control gate 30b, however, the charge escapes to the control gate 30. As a result, the electrons trapped on the first control gate 30a side remain.

Figure 15:
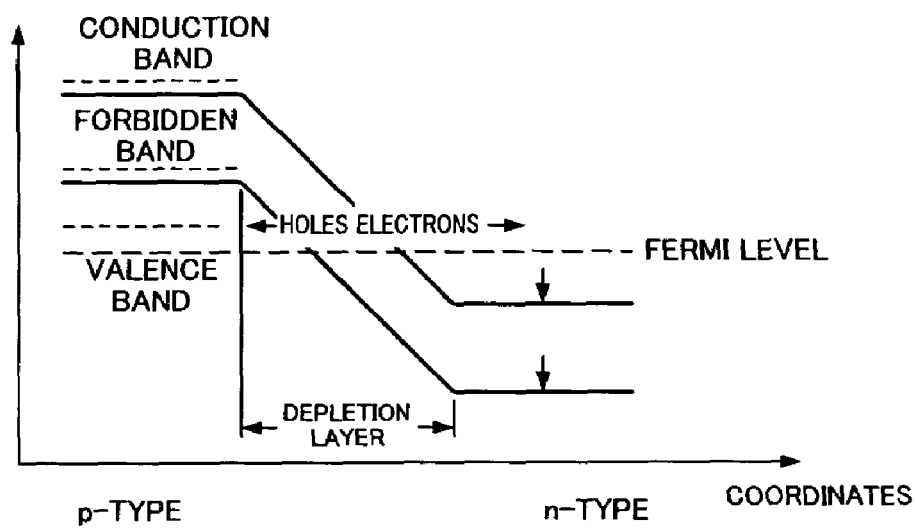
FIG. 15 is illustrative of the operation of erasing in the semiconductor device in accordance with the present invention.

The description now turns to data erasure, with reference to FIG. 15. FIG. 15 is a band chart with the potential energy of electrons along the vertical axis and actual spatial coordinates along the horizontal axis at the edge of the impurity layer 18, in other words, at a pn junction portion.

First of all, a high positive voltage is applied to the impurity layer 18 and a negative voltage is applied to the control gate 30. As a result, the potential energy of electrons in the impurity layer 18 that is an n-type region is reduced (the potential energy of the electrons in the n-type region shift in the direction of the arrow in FIG. 15). In the high-density pn junction, the thickness of the depleted layer is extremely small at only a few nm, making it possible for the electrons in the p-type valence band to migrate by the tunneling effect into the n-type conduction band. In other words, positive holes are created in the vicinity of the edge of the impurity layer 18, which is a p-type region, as the electrons migrate. This means that a hole accumulation layer is formed in the vicinity of the edge of the impurity layer.

In this case, attention is drawn to the electrical fields between the second control gate 30b formed above the second insulating layer 24, the first control gate 30a formed above the first insulating layer 22, and the substrate surface. Since the hole accumulation layer is formed in the second insulating layer 24, carrier conductivity is high. Thus the electrical field in the lateral direction (in the longitudinal gate direction) is relatively low. Since the second insulating layer 24 is thinner than the first insulating layer 22, the electrical field in the orthogonal direction is relatively high. Thus the holes that are created in the vicinity of the edge of the impurity layer 18 cannot jump into the second insulating layer 24 in the region of the second insulating layer 24, In the first insulating layer 22 region, on the other hand, the electrical field is relatively high in the lateral direction but relatively low in the orthogonal direction. Thus the holes that are created in the vicinity of the edge of the impurity layer 18 have a large amount of energy in the boundary between the second insulating layer 24 region and the first insulating layer 22 region, and jump into the charge accumulation layer. In other words, holes are implanted into locations close to a region where the thickness of the charge accumulation layer is different, and erasing is done at those positions.

This makes it possible to ensure that the positions at which electrons are implanted during writing match the positions at which holes are implanted during erasure. As a result, it is possible to implement a non-volatile memory device that does not deteriorate even during repetitions of the write/erase cycle.

2. Method of Fabricating Semiconductor Device

The description now turns to a method of fabricating the semiconductor device in accordance with this embodiment, with reference to FIGS. 3 to 13. Each section corresponds to the portion taken along the line A—A of FIG. 1. In FIGS. 3 to 13, the same reference numbers are used to denote substantially the same portions as those shown in FIGS. 1 and 2, and redundant description is omitted.

(1) First of all, the element isolation region 300 is formed by a trench isolation method in the surface of the semiconductor substrate 10 (see FIG. 1). Ions of a p-type impurity are then implanted as channel doping. The contact n-type impurity layer 400 (see FIG. 1) is then formed in the semiconductor substrate 10.

Figure 3:
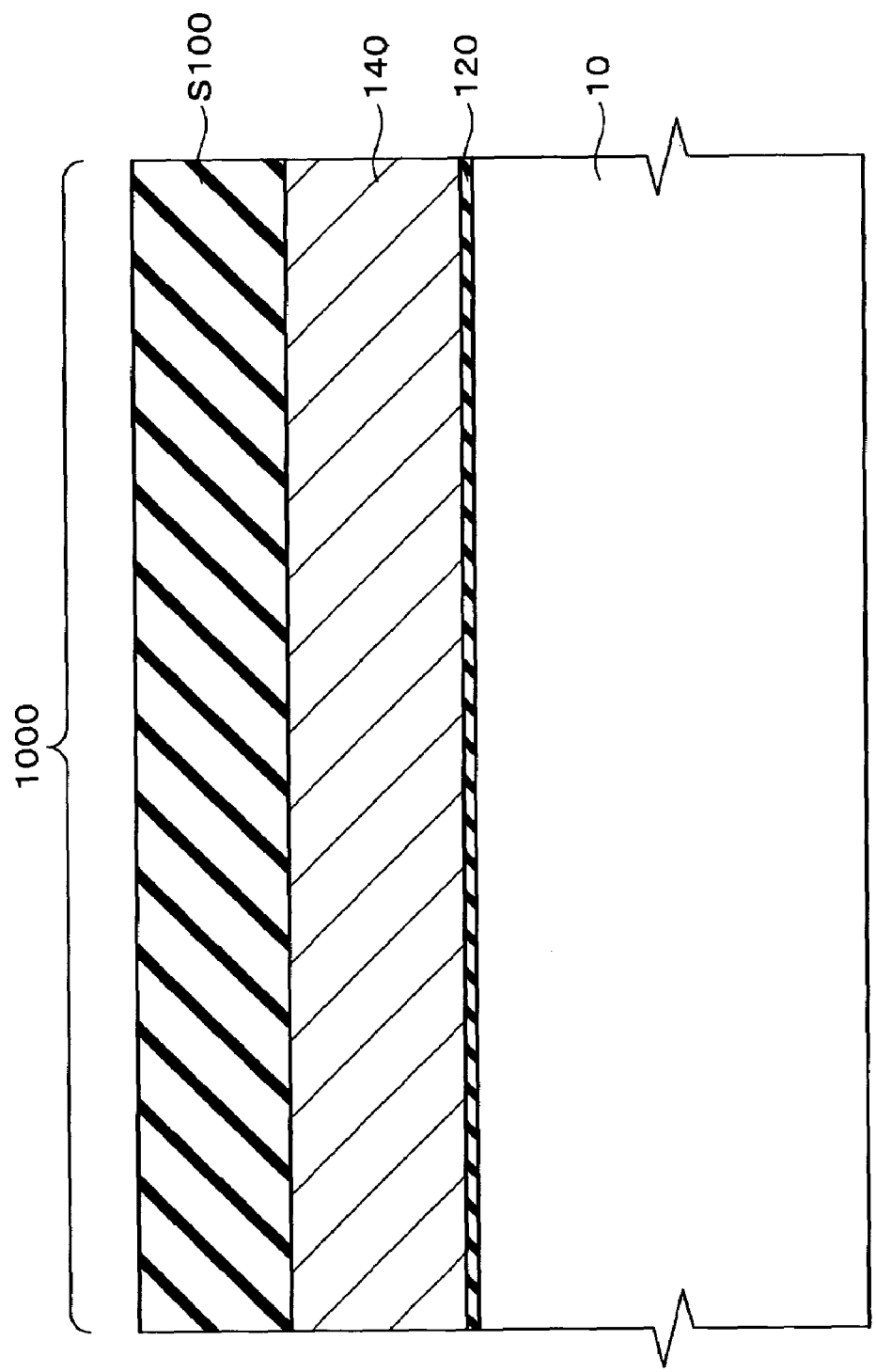
FIG. 3 is a sectional view showing one step in the method of fabricating the semiconductor device shown in FIGS. 1 and 2.

An insulating layer 120 that will form the gate insulating layer is then formed on the surface of the semiconductor substrate 10, as shown in FIG. 3. A gate layer (first conductive layer) 140 that will form the word gate 14 is deposited over the insulating layer 120. The gate layer 140 is formed of doped polysilicon. In a subsequent CMP step, a stopper layer S100 is then formed on the gate layer 140. The stopper layer S100 is formed from a silicon nitride layer.

Figure 4:
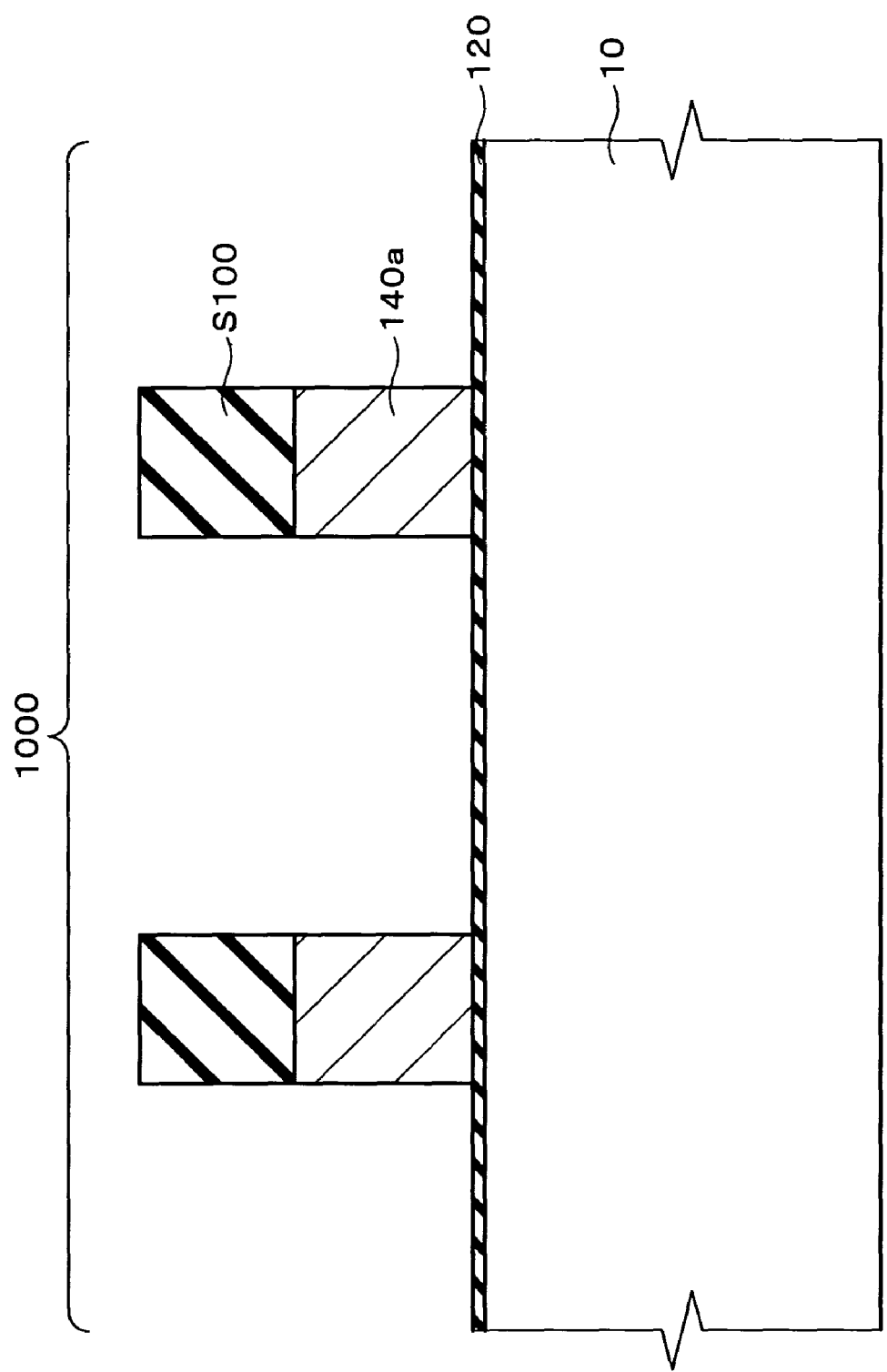
FIG. 4 is a sectional view showing one step in the method of fabricating the semiconductor device shown in FIGS. 1 and 2.

(2) A resist layer (not shown in the figure) is then formed. This resist layer is used as a mask for patterning the stopper layer S100. The thus-patterned stopper layer S100 is used as a mask for etching the gate layer 140. As shown in FIG. 4, the gate layer 140 is patterned to form a gate layer (word gate) 140a.

Figure 5:
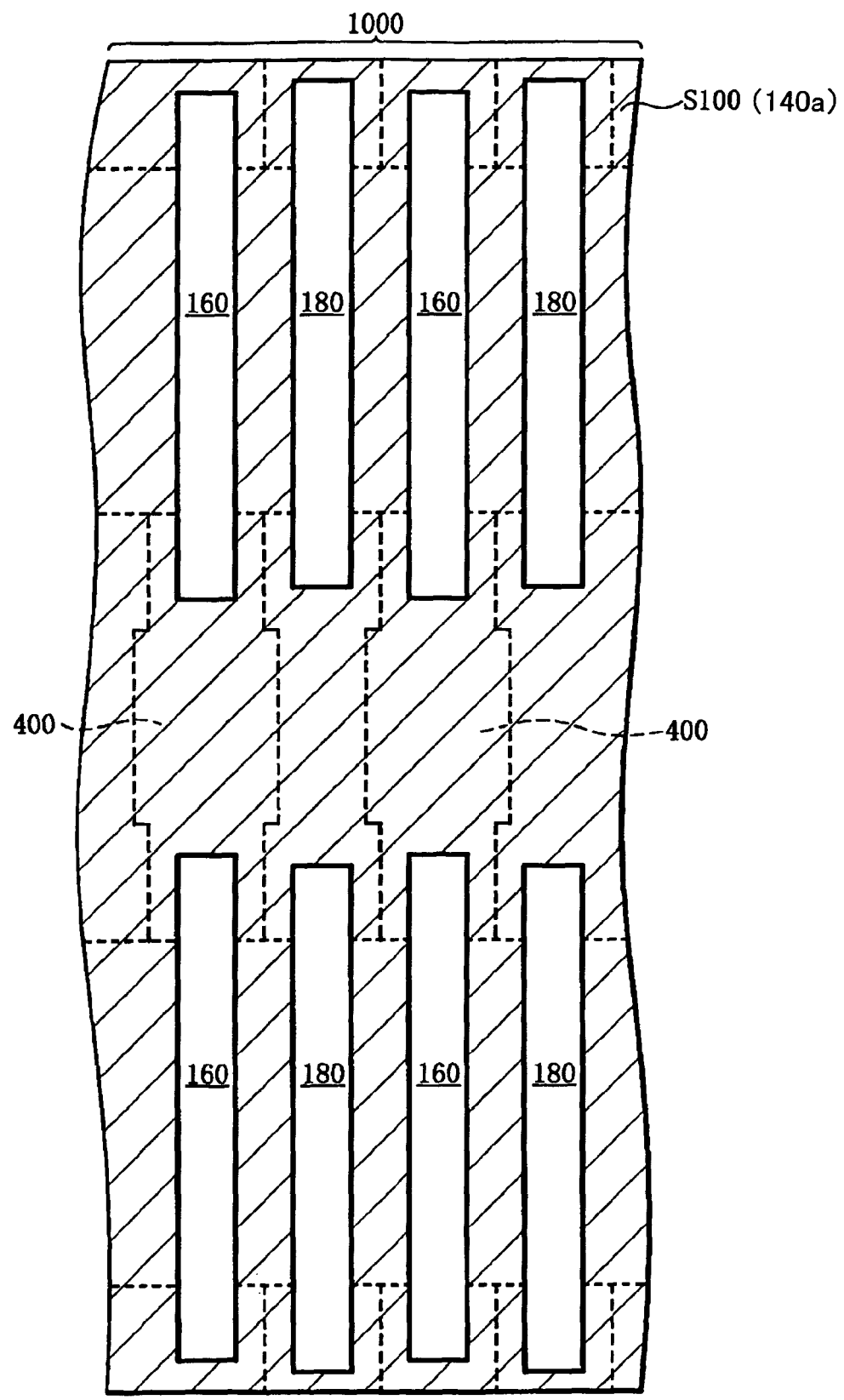
FIG. 5 is a plan view showing one step in the method of fabricating a semiconductor device shown in FIG. 4.

The status after the patterning is shown in plan view in FIG. 5. Aperture portions 160 and 180 are provided by this patterning in the stack formed by the gate layer 140a and the stopper layer S100 within the memory region 1000. The aperture portions 160 and 180 correspond substantially to regions in which the impurity layers 16 and 18 will be formed by subsequent ion implantation. The side insulating layers and control gates will also be formed on the side surfaces of the aperture portions 160 and 180 by subsequent processing.

Figure 6:
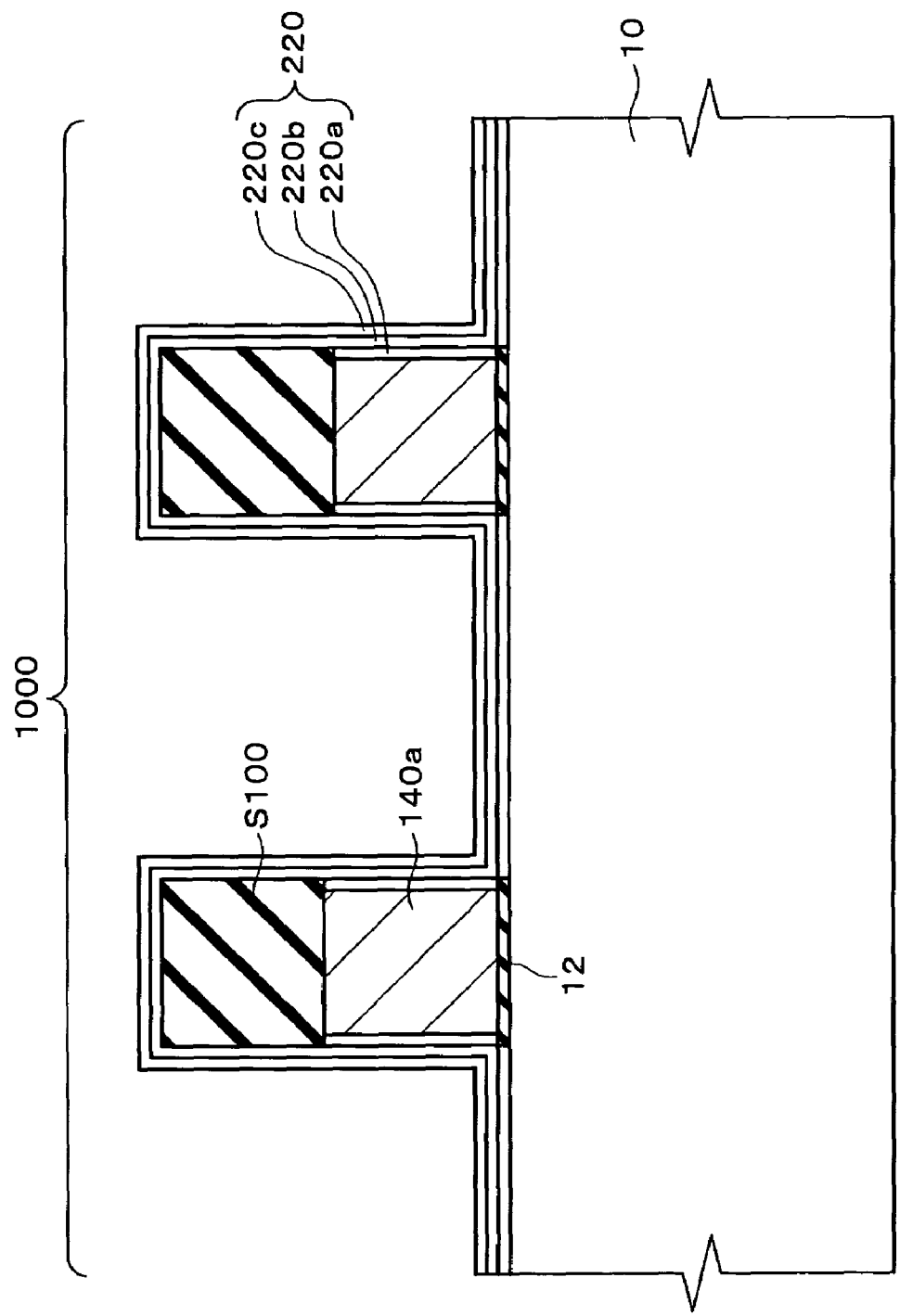
FIG. 6 is a sectional view showing one step in the method of fabricating the semiconductor device shown in FIGS. 1 and 2.

(3) Dilute hydrofluoric acid is then used to wash the surface of the semiconductor substrate 10. This removes the exposed insulating layer 120. A first silicon oxide layer 220a is then formed by a thermal oxidation method, as shown in FIG. 6. The first silicon oxide layer 220a is formed on the exposed surfaces of the semiconductor substrate 10 and the gate layer 140a. During the formation of the first silicon oxide layer 220a by the thermal oxidation method, a thin first silicon oxide layer is also formed on the exposed surfaces of the stopper layer S100. Note that the first silicon oxide layer 220a could also be formed by a CVD method.

Annealing is then performed on the first silicon oxide layer 220a. This annealing is performed in an environment comprising $NH_3$. This preprocessing facilitates the uniform deposition of a silicon nitride layer 220b above the first silicon oxide layer 220a. The silicon nitride layer 220b can be subsequently formed by a CVD method.

A second silicon oxide layer 220c is then formed by a CVD method, specifically by high-temperature oxidation (HTO). This enables the formation of an ONO film 220.

The second silicon oxide layer 220c can also be formed by using in-situ steam generation (ISSG). ISSG processing enables detailed film formation. If the film is formed by ISSG processing, the ONO film 220 will be very accurate so annealing can be omitted. Note that forming the silicon nitride layer 220b and the second silicon oxide layer 220c in the same furnace makes it possible to prevent contamination of the boundary surfaces due to removal from the furnace. Since this enables the formation of a homogeneous ONO film 220, it enables the creation of a memory cell 100 with stable electrical characteristics.

In this embodiment of the invention, subsequent patterning creates the first insulating layer 22, the second insulating layer 24, and the side insulating layer 26 from the ONO film 220 (see FIG. 2).

Figure 7:
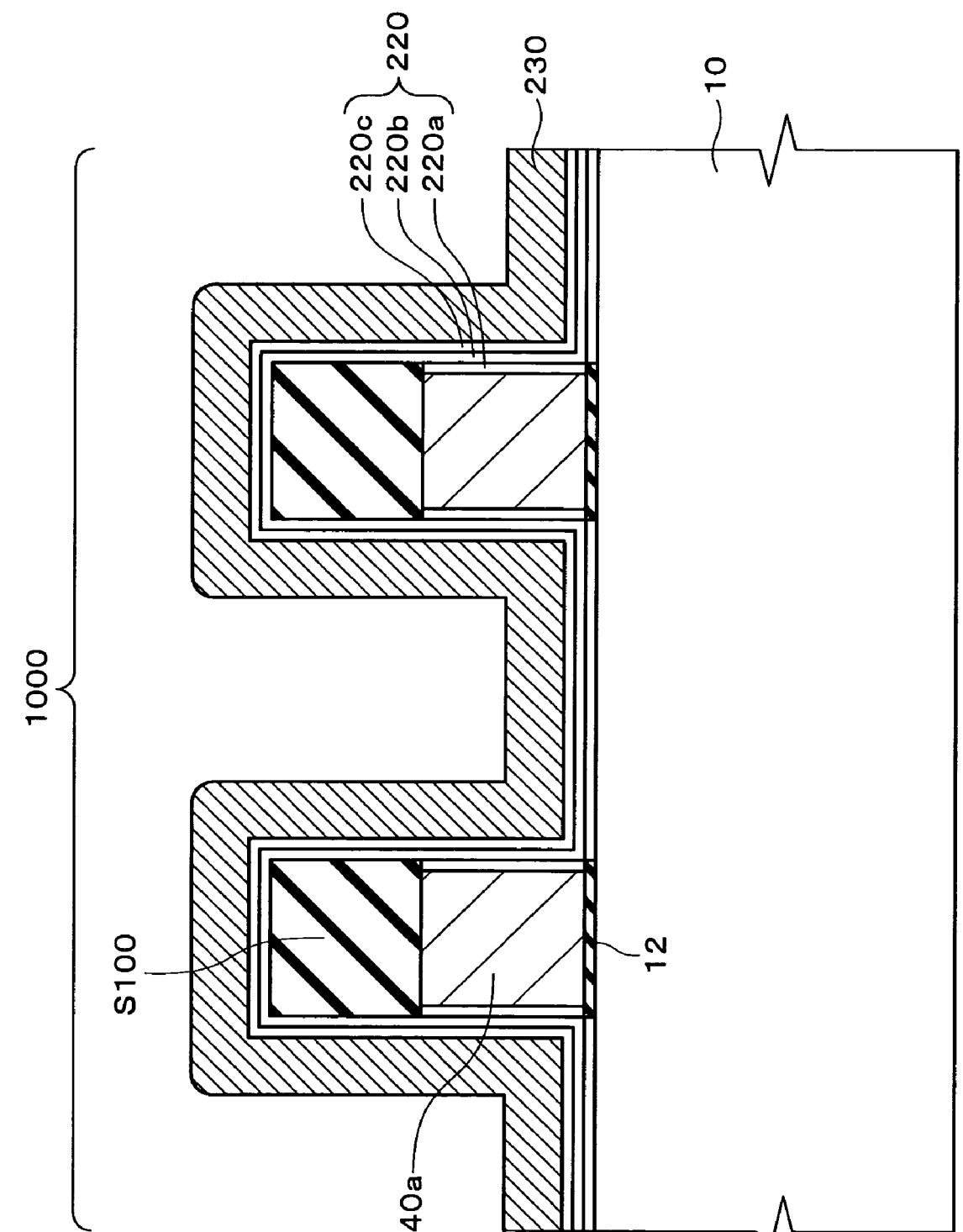
FIG. 7 is a sectional view showing one step in the method of fabricating the semiconductor device shown in FIGS. 1 and 2.

(4) As shown in FIG. 7, a doped polysilicon layer (second conductive layer) 230 is formed over the second silicon oxide layer 220c. The doped polysilicon layer 230 will become the conductive layer 40 (see FIG. 1) that creates the first control gates 20a and 30a by subsequent etching.

Figure 8:
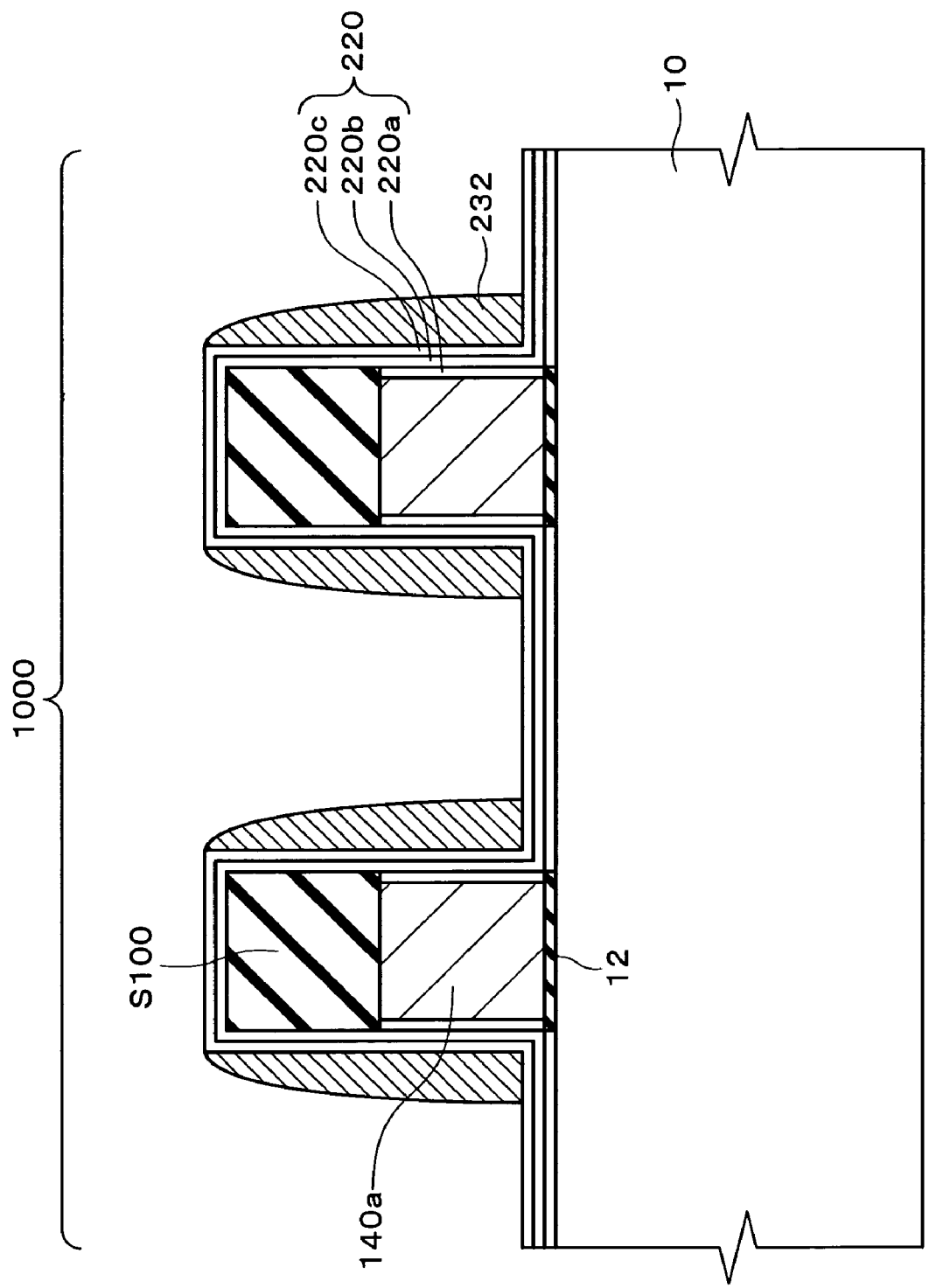
FIG. 8 is a sectional view showing one step in the method of fabricating the semiconductor device shown in FIGS. 1 and 2.

(5) As shown in FIG. 8, the entire area of the doped polysilicon layer 230 is subjected to anisotropic etching. This forms a conductive layer 232 in the form of side walls along the side surfaces of the aperture portions 160 and 180 of the memory region 1000 (see FIG. 5).

Figure 9:
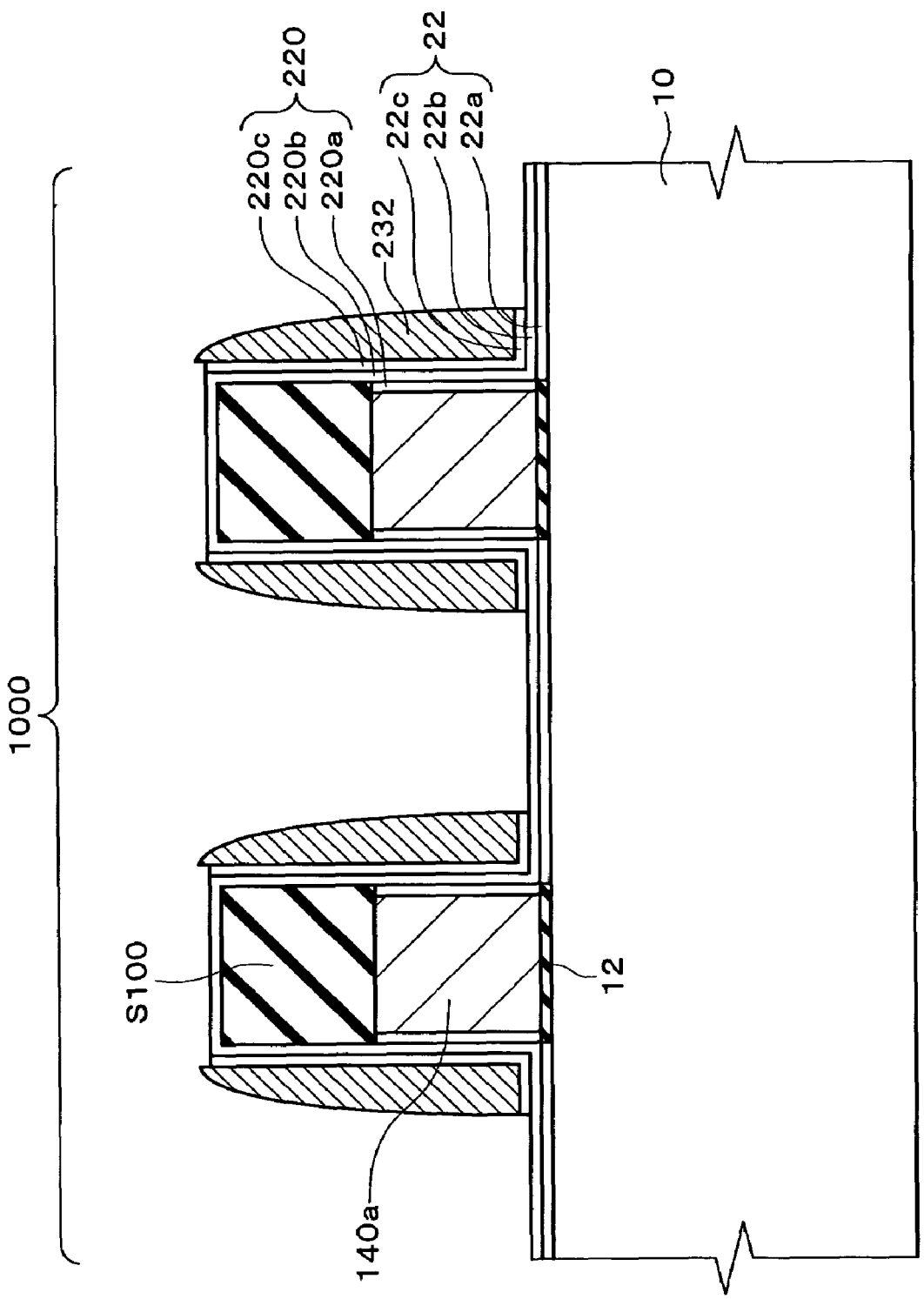
FIG. 9 is a sectional view showing one step in the method of fabricating the semiconductor device shown in FIGS. 1 and 2.
Figure 10:
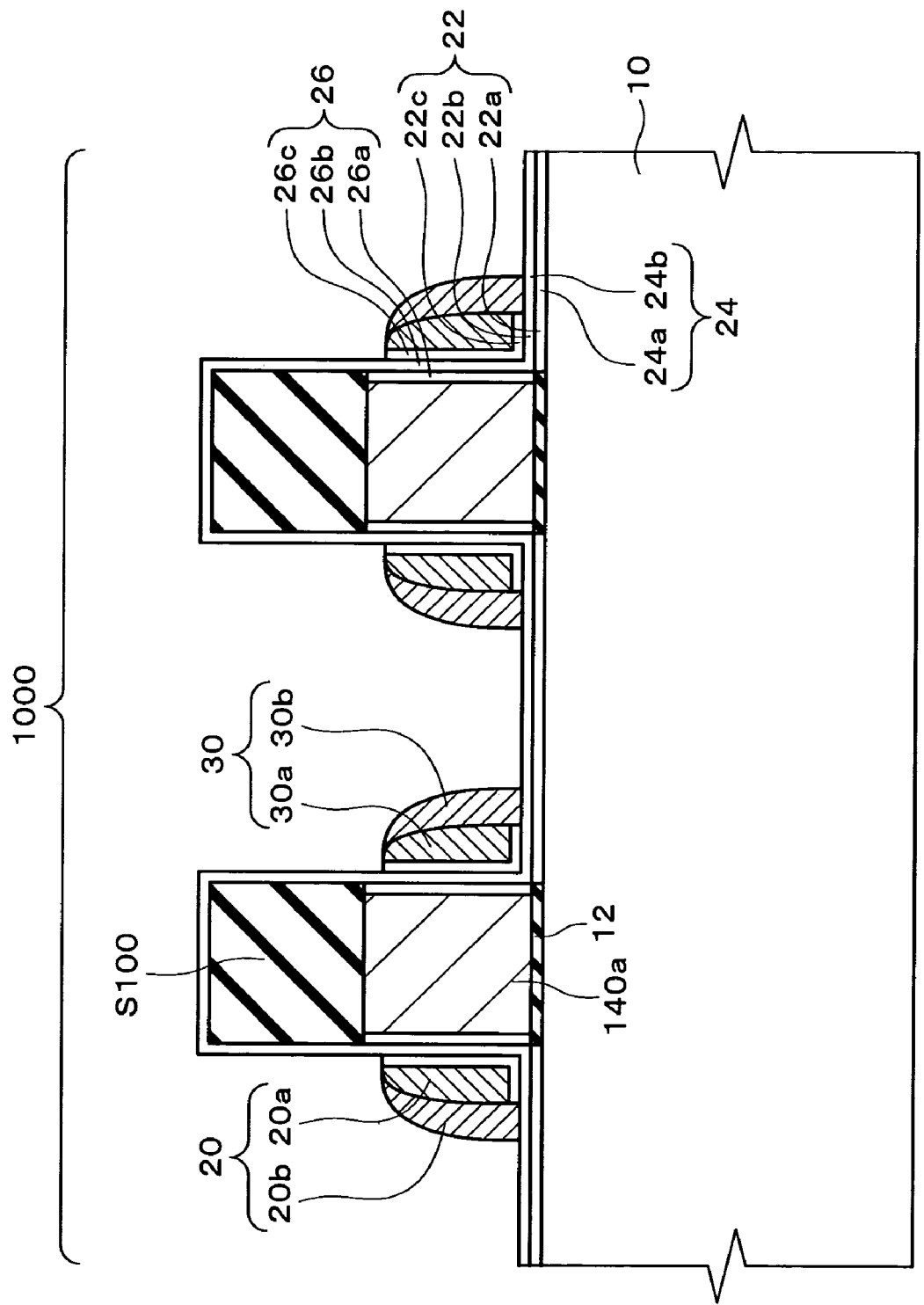
FIG. 10 is a sectional view showing one step in the method of fabricating the semiconductor device shown in FIGS. 1 and 2.

(6) As shown in FIG. 9, the conductive layer 232 in the form of side walls is used as a mask to remove the second silicon oxide layer 220c part of the ONO film 220. More specifically, this can be done by wet etching with dilute hydrofluoric acid. This leaves the first insulating layer 22 that creates the ONO film underneath the first control gates 20a and 30a.

(7) A doped polysilicon layer (not shown in the figures) is then formed over the entire area. The doped polysilicon layer is subsequently removed from the entire area by anisotropic dry etching. This enables the formation of the first control gates 20a and 30a and also the second control gates 20b and 30b above the second insulating layer 24 formed of the first silicon oxide layer 24a and the silicon nitride layer 24b, of a height lower than that of the conductive layer 232 in the form of side walls. Isotropic etching is then used to smooth the surfaces of the control gates 20 and 30. This also removes the exposed second silicon oxide layer 26c.

Figure 11:
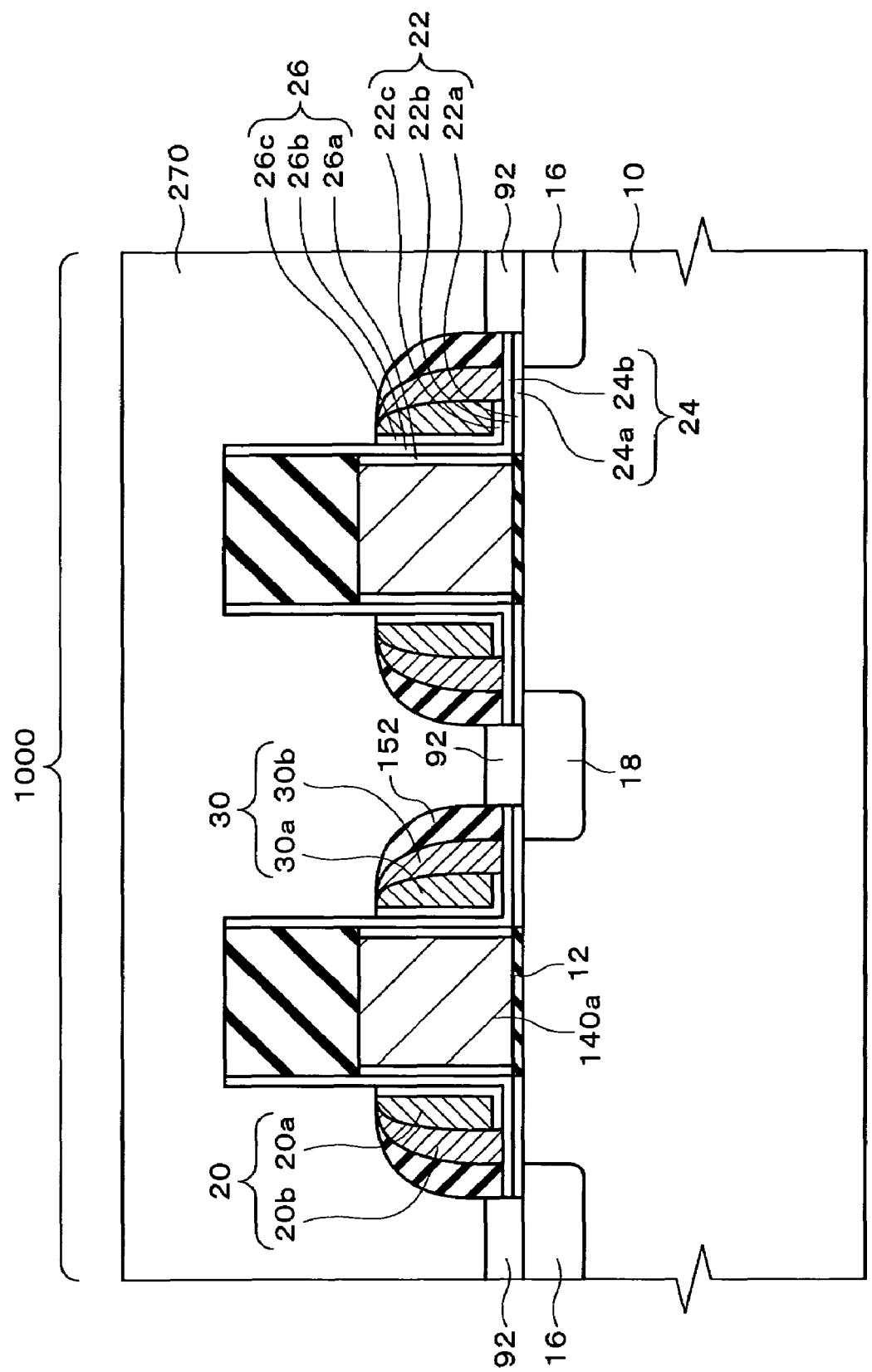
FIG. 11 is a sectional view showing one step in the method of fabricating the semiconductor device shown in FIGS. 1 and 2.

(8) An insulating layer (not shown in the figures) is formed over the entire surface of a material such as silicon oxide or silicon nitride oxide. The side-wall isolation layer 152 that covers the control gates 20 and 30 is formed by anisotropic etching of this insulating layer, as shown in FIG. 11. This etching also removes the insulating layer deposited on the region in which the silicide layer will be formed by subsequent processing, to expose the semiconductor substrate 10.

Ions of an n-type impurity are then implanted to form the impurity layers 16 and 18 in the semiconductor substrate 10, as shown in FIG. 11.

A metal for forming a silicide is then deposited over the entire area. The metal for forming the silicide could be titanium or cobalt, by way of example. The silicide layer 92 is then formed on the exposed surface of the semiconductor substrate 10 by a silicide reaction of the metal formed over the semiconductor substrate 10. A third isolation layer 270 of a material such as silicon oxide or silicon nitride oxide is then formed over the entire area of the memory region 1000. The third isolation layer 270 is formed to cover the stopper layer S100.

Figure 12:
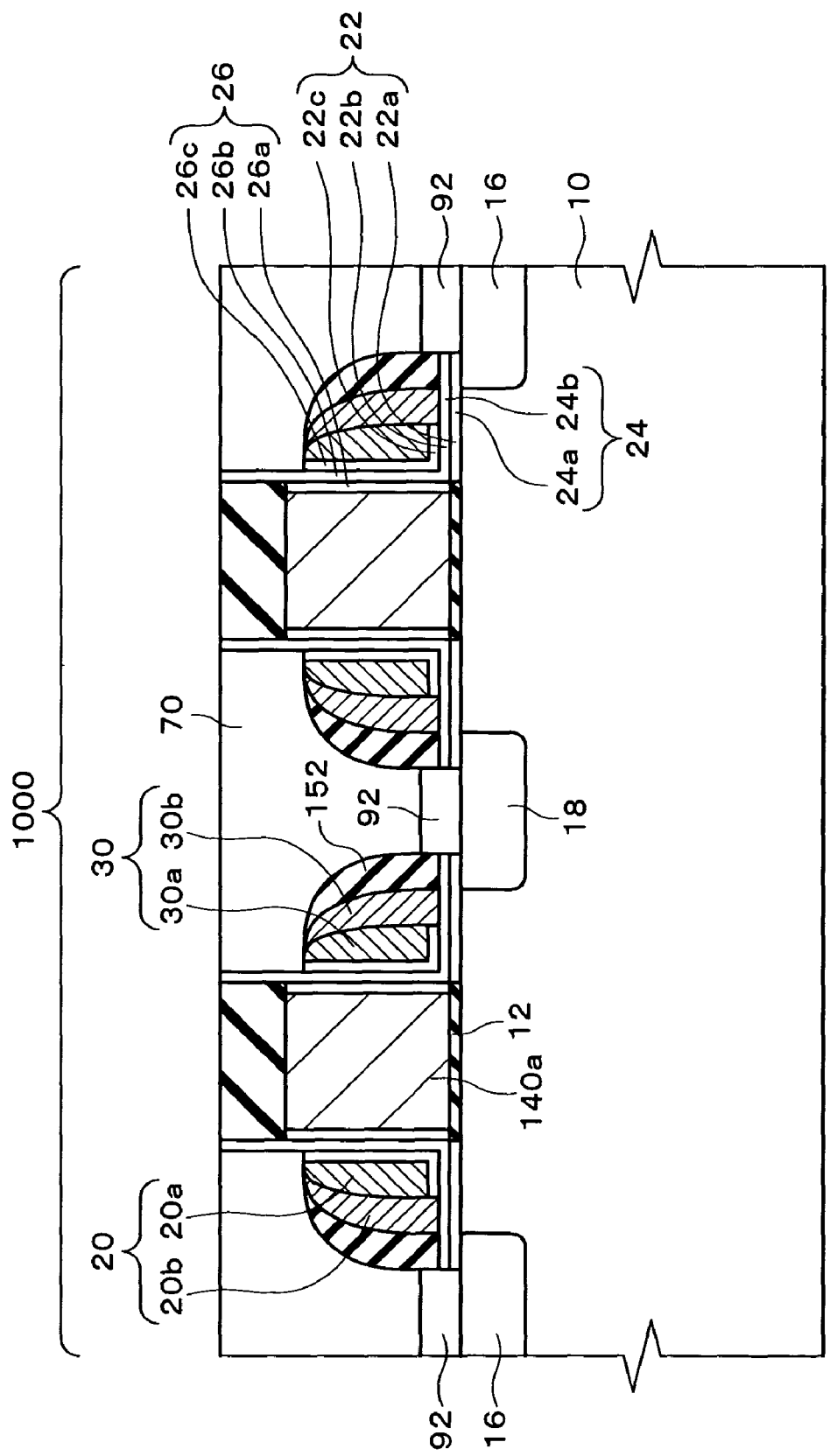
FIG. 12 is a sectional view showing one step in the method of fabricating the semiconductor device shown in FIGS. 1 and 2.
Figure 13:
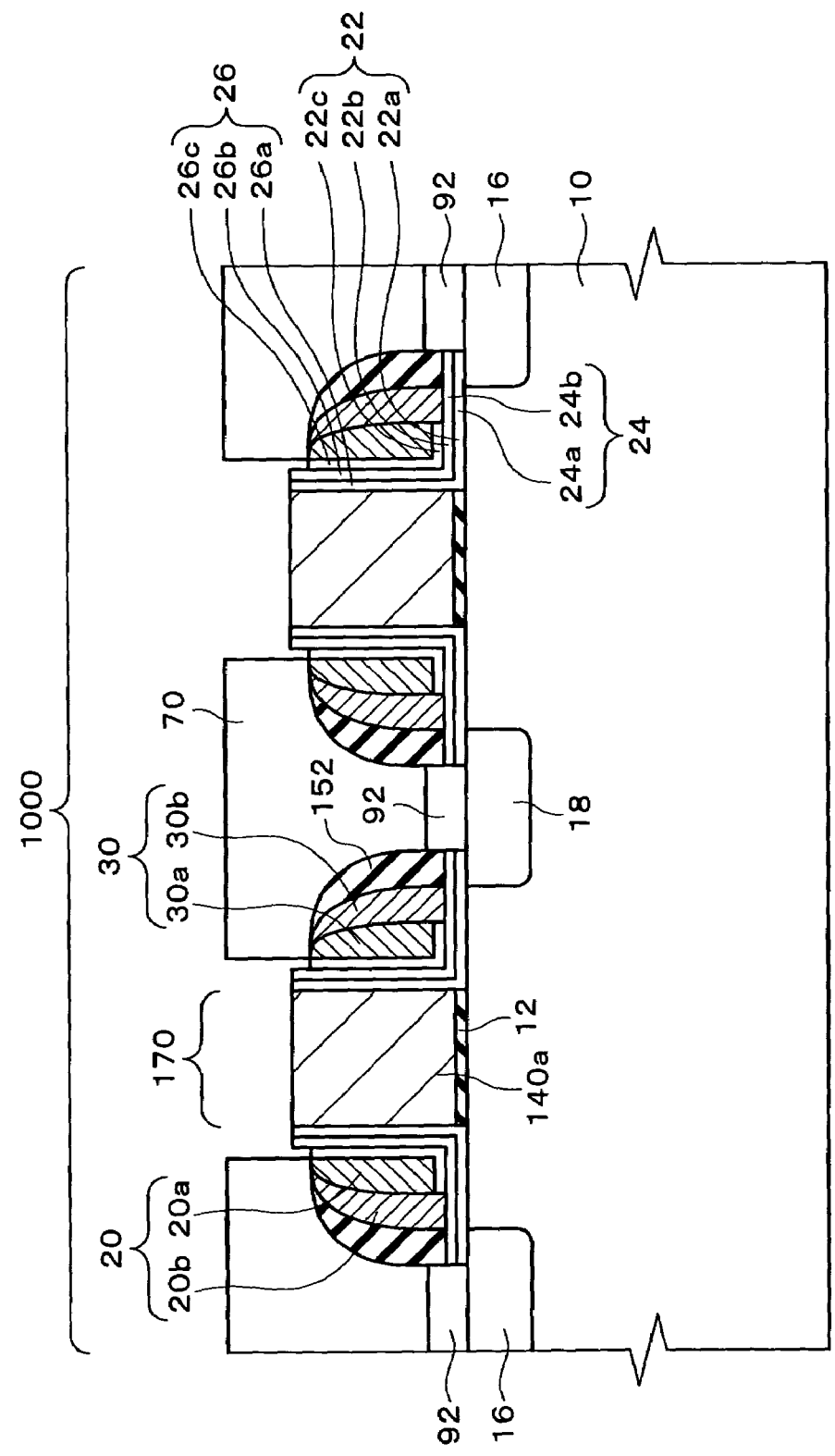
FIG. 13 is a sectional view showing one step in the method of fabricating the semiconductor device shown in FIGS. 1 and 2.
Figure 14:
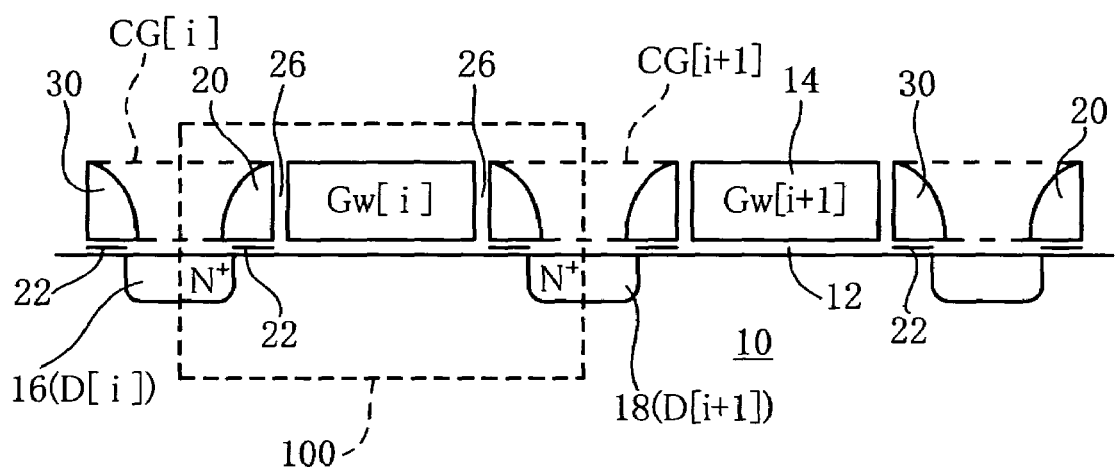
FIG. 14 is a section taken through a known MONOS type of memory cell.

(9) As shown in FIG. 12, the third insulating layer 270 is polished by a CMP method far enough to expose the stopper layer S100, and the third isolation layer 270 is made uniform. This polishing leaves the embedded insulating layer 70 between the opposing control gates 20 and 30.

(10) The stopper layer S100 is removed by hot phosphoric acid. As a result, at least the upper surface of the gate layer 140a is exposed to form an aperture portion 170 in the third isolation layer 270. In other words, this aperture portion 170 is a region formed by the removal of the stopper layer S100, positioned above the gate layer 140a.

(11) A doped polysilicon layer (not shown in the figures) is subsequently formed over the entire area. A resist layer (not shown in the figures) is formed by patterning this doped polysilicon layer. The resist layer is used as a mask to pattern the doped polysilicon layer and form the word line 50 (see FIG. 1).

The resist layer is then used as a mask to etch the gate layer 140a. This etching removes the part of the gate layer 140a that does not have the word line 50 formed thereabove. As a result, the word gates 14 can be formed in an array. The removed region of the gate layer 140a corresponds to the region in which a p-type impurity layer (impurity layer for element isolation) 15 will be formed subsequently.

Note that the control gates 20 and 30 are covered by the embedded insulating layer 70 so are not etched by this etching step and thus remain.

A p-type impurity is then doped into the entire area of the semiconductor substrate 10. This forms the p-type impurity layer (impurity layer for element isolation) 15 in regions between the word gates 14 in the Y direction (see FIG. 1). This p-type impurity layer 15 provides reliable element isolation between adjacent non-volatile semiconductor memory devices 100.

The above steps enable the fabrication of the semiconductor device of FIGS. 1 and 2.

The advantages provided by this fabrication method are described below.

The control gates 20 and 30 are formed by a two-stage process. More specifically, the first control gates 20a and 30a are formed, then the second silicon oxide layer 220c of the ONO film 220 is removed and subsequently the second control gates 20*b* and 30*b* are formed. For that reason, the control gates 20 and 30 can be formed on top of insulating layers of different thicknesses. As a result, it becomes possible to fabrication a semiconductor device in which the field strengths of the control gates 20 and 30 and the substrate surface are non-uniform.

The first control gates 20*a* and 30*a* are formed simultaneously with the formation of the second control gates 20*b* and 30*b* by the etching of the doped polysilicon layer in step (7). For that reason, the heights of the first control gates 20*a* and 30*a* and the second control gates 20*b* and 30*b* can be arranged easily. This makes it possible to form the control gates 20 and 30 of any desired shape.

The present invention was described above with respect to one embodiment thereof, but the present invention is not limited thereto and thus there are various different modifications thereto within the scope of the invention laid out herein.

For example, in step (6), dry etching could be used instead of the wet etching with dilute hydrofluoric acid, during the removal of the second silicon oxide layer 220*c* of the ONO film 220. In such a case, the etching would be perpendicular, enabling a favorable state of the edge surfaces of the second silicon oxide layer 220*c*.

In addition, a semiconductor substrate in bulk form was used as the semiconductor layer in the above described embodiment, but it is equally possible to use a semiconductor layer of a SOI substrate.

What is claimed is:

1. A semiconductor device having a memory region in which a memory cell array is formed of non-volatile memory devices arranged in a matrix of a plurality of rows and columns, wherein each of the non-volatile memory devices has:
    a word gate formed above a semiconductor layer with a gate insulating layer interposed;
    an impurity layer formed in the semiconductor layer to form a source region or a drain region; and
    control gates in the form of side walls formed along both side surfaces of the word gate, wherein each of the control gates includes a first control gate and a second control gate in mutual contact;
    a first insulating layer is disposed between the first control gate and the semiconductor layer, and a side insulating layer is disposed between the first control gate and the word gate;
    a second insulating layer is in direct contact with the second control gate and the semiconductor layer and disposed between the second control gate and the semiconductor layer; and
    a thickness of the first insulating layer is larger than a thickness of the second insulating layer.

2. The semiconductor device as defined in claim 1, wherein the first insulating layer is a stack of a first silicon oxide layer, a silicon nitride layer, and a second silicon oxide layer.

3. The semiconductor device as defined in claim 1, wherein the second insulating layer is a stack of a silicon oxide layer and a silicon nitride layer.

4. A semiconductor device having a memory region in which a memory cell array is formed of non-volatile memory devices arranged in a matrix of a plurality of rows and columns,
    wherein each of the non-volatile memory devices has:
    a word gate formed above a semiconductor layer with a gate insulating layer interposed;
    an impurity layer formed in the semiconductor layer to form a source region or a drain region;
    control gates in the form of side walls formed along one side surface of the word gate;
    the control gates include a first control gate and a second control gate in mutual contact;
    a first insulating layer is disposed between the first control gate and the semiconductor layer, and a side insulating layer is disposed between the first control gate and the word gate;
    a second insulating layer is in direct contact with the second control gate and the semiconductor layer, and disposed between the second control gate and the semiconductor layer; and
    a thickness of the first insulating layer is larger than a thickness of the second insulating layer.

* * * * *